United States Patent
Herbsommer et al.

(10) Patent No.: US 9,508,633 B2
(45) Date of Patent: Nov. 29, 2016

(54) HIGH PERFORMANCE POWER TRANSISTOR HAVING ULTRA-THIN PACKAGE

(75) Inventors: Juan A. Herbsommer, Schnecksville, PA (US); Osvaldo J. Lopez, Annandale, NJ (US); Jonathan A. Noquil, Bethlehem, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1016 days.

(21) Appl. No.: 13/214,801

(22) Filed: Aug. 22, 2011

(65) Prior Publication Data

US 2013/0049077 A1 Feb. 28, 2013

(51) Int. Cl.
*H01L 29/78* (2006.01)
*H01L 23/495* (2006.01)
*H01L 23/00* (2006.01)
*H01L 23/31* (2006.01)

(52) U.S. Cl.
CPC ... *H01L 23/49562* (2013.01); *H01L 23/49503* (2013.01); *H01L 23/49524* (2013.01); *H01L 24/36* (2013.01); *H01L 24/40* (2013.01); *H01L 23/3107* (2013.01); *H01L 2224/32245* (2013.01); *H01L 2224/40245* (2013.01); *H01L 2924/1306* (2013.01); *H01L 2924/13091* (2013.01); *H01L 2924/181* (2013.01)

(58) Field of Classification Search
CPC .................. H01L 23/49562; H01L 24/36
USPC .................................................. 257/288
See application file for complete search history.

(56) References Cited

U.S. PATENT DOCUMENTS

| | | | |
|---|---|---|---|
| 2009/0057855 A1* | 3/2009 | Quinones | H01L 23/49551 257/676 |
| 2010/0148346 A1* | 6/2010 | Quinones | H01L 23/49524 257/690 |
| 2010/0224972 A1* | 9/2010 | Powell | H01L 21/4832 257/676 |
| 2011/0074007 A1* | 3/2011 | Lopez et al. | 257/692 |
| 2011/0163430 A1* | 7/2011 | Lee et al. | 257/676 |

* cited by examiner

*Primary Examiner* — Moazzam Hossain
(74) *Attorney, Agent, or Firm* — Charles A. Brill; Frank D. Cimino

(57) ABSTRACT

A field-effect transistor package includes a leadframe with a first linear thickness (150*a*) and a leadframe pad (151) of a reduced thickness; a first terminal of a field-effect transistor chip (140) attached to the pad and a second and a third terminal remote from the pad; a metal sheet (110) of a second linear thickness (110*a*) connecting the second transistor terminal to a package terminal; a metal sheet (112) of a third linear thickness (112*a*) connecting the third transistor terminal to a package terminal; the sum of the first linear thickness (about 0.125 mm) and the second linear thickness (about 0.125 mm) plus attach material (about 0.05 mm) comprising the package thickness (about 0.3 mm).

10 Claims, 3 Drawing Sheets

HIGH PERFORMANCE POWER TRANSISTOR HAVING ULTRA-THIN PACKAGE

FIELD OF THE INVENTION

The present invention is related in general to the field of semiconductor devices and processes, and more specifically to the structure and fabrication method of ultra-thin QFN-packaged power transistors capable of high current, high efficiency, and high velocity.

DESCRIPTION OF RELATED ART

For many of today's power switching devices, the chips of the power MOSFETs are assembled as individual components. The devices use a metallic leadframe, which typically has a rectangular pad surrounded by leads; the pad serves as substrate for attaching the semiconductor chip and the leads serve as output terminals. The leads are commonly shaped without cantilever extensions, and arranged in the manner of Quad Flat No-Lead (QFN) or Small Outline No-Lead (SON) devices. The electrical connections from the chip to the leads can be provided in several ways.

In one family of devices, the connections are provided by bonding wires. These wires may introduce, due to their lengths and resistances, significant parasitic inductance into the power circuit. Each assembly is typically packaged in a plastic encapsulation, and the packaged components are employed as discrete building blocks for board assembly of power supply systems. In other device families, metal clips substitute for many or all connecting wires. These clips are wide and introduce smaller parasitic inductance and resistance compared to wires.

Devices of these families are several millimeters. In order reduce the device thickness to about 1.5 mm, another recently introduced power MOSFET assembly avoids connecting clips and wire bonds by providing a leadframe with an assembly pad divided into two portions for a power chip with a first and a second terminal on one chip side and a third terminal on the opposite chip side. The chip is flip-assembled (using metal bumps or solder paste dispensed from a syringe) onto the leadframe pad so that the first terminal is contacting one pad portion and the second terminal is contacting the other pad portion. Both leadframe portions have rims bent so that, after the flip-assembly, the rims become coplanar with the third terminal; all three MOSFET terminals can thus be attached to a printed circuit board (PCB). After this attachment, the leadframe pad is remote from the PCB, but since it is divided into two portions serving two die terminals, a heat sink cannot be attached to the pad.

In still another recently introduced power MOSFET package, a leadframe is provided with a flat pad divided into two portions, which can be attached to a PCB. The first and the second terminals of a power chip are attached to these pad portions. The third chip terminal, remote from the leadframe pad, is contacted by a metal clip, which has a rim bent towards a lead of the leadframe, allowing all three die terminals to be assembled on the PCB. The clip is made of a metal thick enough to permit the attachment of a heat sink to the clip for cooling the third chip terminal.

Another recently proposed power MOSFET package reduces the device thickness to 1.0 to 1.5 mm by a package structure without wire bonds or clips. The structure requires that the leadframe pad is half-etched to create a thicker and a thinner portion. This means, the leadframe cannot be stamped. During the chip assembly process, the coplanar side of the pad is facing downward. As another requirement, a special flip-chip equipment needs to be developed, which is capable of attaching the chip from the bottom; the FET source is attached to the thicker pad portion and the FET gate to the thinner pad portion. This thinner portion is covered with packaging compound during the encapsulation process. In addition, separate piece parts are needed to level the package terminals with the FET drain and an extra metal layer may have to be deposited and patterned to mimic the standard QFN footprint.

SUMMARY OF THE INVENTION

Applicants recognized that widespread applications of power converters in markets as diverse as handheld, laptop, automotive, and medical products require packages for MOS field effect transistors (FETS), which not only permit direct implementation into established printed circuit boards (PCB), but also have a thickness much less than the conventional 1.5 mm. Furthermore, the power FETS should offer performances including current, efficiency and velocity near the theoretical maximum. Applicants saw that cooling the transistor package from both surfaces very close to the junction will lower the operating junction temperature so that higher currents can be handled; that reducing the conduction losses by reducing parasitic resistance and inductance will lower the power losses so that the efficiency can be increased; and that reducing package-related capacitance will lower switching losses so that the velocity performance can be increased.

Applicants solved the problem of reducing the overall thickness of high power MOSFET packages, when they discovered that a package thickness of about 0.3 mm can be achieved as the sum of a clip with the technically feasible linear thickness of 0.125 mm and a leadframe with the technically feasible linear thickness of 0.125 mm, wherein the leadframe has a pad with reduced thickness for attaching the chip coplanar with the linear leadframe thickness. With metal leadframe and clip exposed on opposite package sides, double-cooling close to the junction will enable increased current handling up to about 35 A. Applicants further found that the new assembly allows clips without bent rim, thereby reducing parasitic resistance and inductance, leading to increased efficiency and velocity. As an unexpected benefit, applicants found that a clip without rims reduces the customary "ringing" of transistor off-on-off operations.

In an exemplary preferred embodiment, the power FET package has a length of 6 mm and a width of 5 mm. The first FET terminal is the source, the second terminal is the drain, and the third terminal is the gate. The drain is attached to the leadframe pad, the source and the gate to the clip. All three terminals show on one package side with a standard QFN footprint and are available for attachment to a PCB; the exposed metal of the leadframe pad on the opposite package surface is available for attachment of a heat sink. The package thickness consists of the sum of the linear thickness of the leadframe and the linear thickness of the clip, totaling 0.3 mm including the adhesive material. With the heat sink attached to the clip and the leadframe pad also cooled, the FET package can handle currents between about 25 and 40 A.

The leadframe pad has a smaller thickness than the leadframe linear thickness (first linear thickness); after attaching the chip to the pad, the thickness of chip and pad together are equal to the first linear thickness. While fabricating a pad of reduced thickness from the original first linear thickness, it may be a technical advantage to retain a rim in the original linear thickness around at least one perimeter side of the pad, since such rims facilitate the assembly process. For example, rims around all four pad sides can act as stops to contain the spreading of chip attach materials such as solder.

The fabrication of an exemplary power FET package starts with selecting a leadframe of first linear thickness. The smallest commercially available thickness is 0.125 mm. A reduced thickness for the pad (for instance 0.075 mm) is achieved by partial etching of a portion of the leadframe; one surface of the leadframe, however, remains coplanar and thus offers a plane for the package terminals. Next, the FET chip is attached to the pad; in the exemplary example quoted, the FET drain is attached to the pad. Materials for attachment include conductive adhesive and solder. As mentioned, after chip attachment, chip and pad have the first linear thickness. Source and gate of the FET are connected to package terminals by clips, the source by a clip of a second linear thickness and the gate by a clip of reduced thickness (reduced relative to second thickness). Both clips are free of bent rims and thus reduce parasitic resistances and inductances by 20 to 30%, and offer reduced package-related capacitance compared to conventional power FET packages which employ clips with bent rims and an un-etched pad. Consequently, power and switching losses are reduced and efficiency and velocity enhanced.

In the following encapsulation process, the aforementioned reduced-thickness clip is covered with encapsulation compound, while the surface of the thicker clip remains available for the attachment of a heat sink suitable for directly cooling the heat caused by the operational current of the FET.

DETAILED DESCRIPTION OF THE PREFERRED EMBODIMENTS

Figure 1:
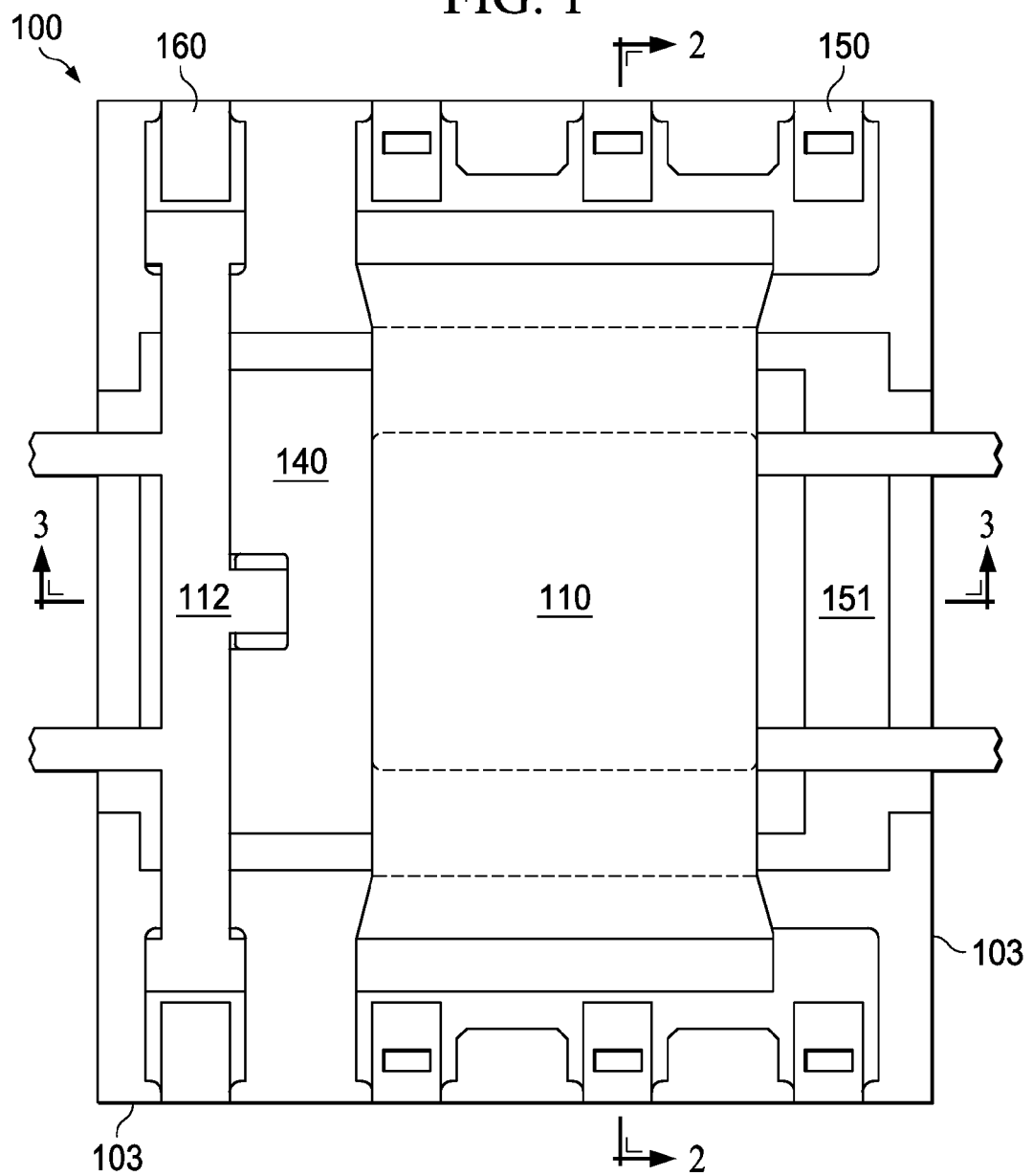
FIG. 1 shows a top view of a power field-effect transistor assembled between leadframe and clip and encapsulated in transparent packaging material.
Figure 2:
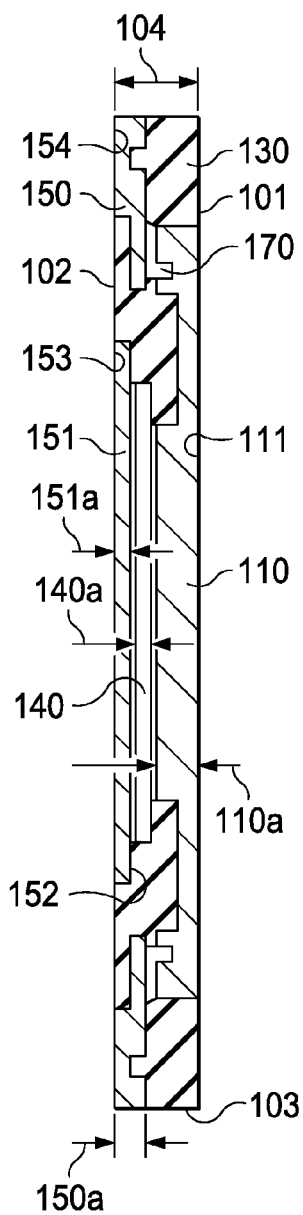
FIG. 2 depicts a cross section of the packaged FET of FIG. 1 along the line indicated in FIG. 1.
Figure 3:
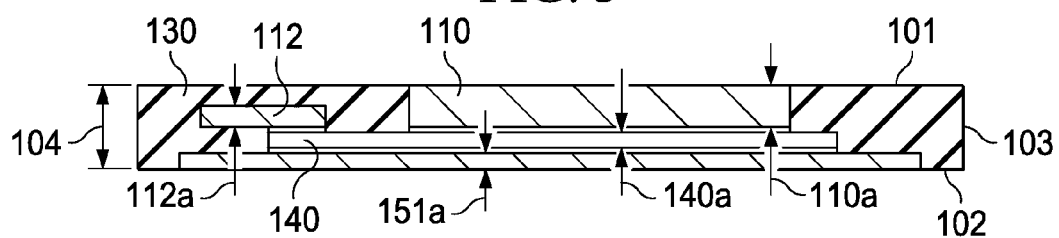
FIG. 3 illustrates a cross section of the packaged FET of FIG. 1 along the line indicated in FIG. 1.

FIGS. 1, 2, and 3 illustrate an exemplary embodiment of the invention, the package of a semiconductor power chip 140 intended for assembly on a substrate such as a motherboard. The package is particularly useful for packaging power field effect transistors (FET), power switches, power converters, which handle large electrical currents (for example, 25 to 40 A) and thus generate significant heat. Chip 140 has a thickness 140a; for the example shown, thickness 140a is preferably about 0.05 mm; in other embodiments, chip 140 may be thicker or thinner. The FET has a first, a second and a third terminal. The power device, generally designated 100, is depicted in top view (FIG. 1) and in cross sections FIGS. 2 and 3). The cutaway lines in FIG. 1 indicate the positions of the cross sections. For clarity's sake, the top view of FIG. 1 is depicted under the assumption that the packaging compound 130 is transparent; in reality, the insulating compound has to be opaque (for instance a black-colored epoxy-based molding compound) in order to protect the semiconductor chip against light in the visible wave length regime.

FIGS. 2 and 3 indicate that the package of device 100 has a planar top surface 101, a planar bottom surface 102, side surfaces 103 at right angles with the top and bottom surfaces, and a thickness 104 small compared to the lateral dimensions of the device. A preferred thickness range is 0.3 mm or less, for instance between 0.26 and 0.28 mm. The large metal area 111, exposed on the top surface 101, belongs to a flat sheet designated 110. Sheet 110 is herein referred to as clip; it is generally flat and has in particular no bending at any portion of the perimeter, may however include few indents, grooves, or similar intentional surface unevenness (generated preferably by partial etching) for improving the adhesion between clip and encapsulation compound, or for inhibiting the spreading of adhesion material 170 such as solder during the attachment step of clip 110 to leads 150.

Through metal area 111, clip 110 can dissipate a significant amount of heat into the ambient; the thermal energy is generated during the operation of the power chip 140, which is attached to the surface 152 of leadframe pad 151. The heat dissipation can be greatly enhanced when a heat sink is attached to metal area 111. In order to facilitate the attachment of a heat sink, it is an advantageous to provide the metal area 111 with a solderable metallurgical preparation, such as a layer of tin or nickel. Clip 110 is preferably made of copper or copper alloy; other alternatives include iron-nickel alloys (such as Alloy 42), aluminum, and Kovar™. Clip thickness 110a is preferably between about 0.12 and 0.13 mm, more preferably 0.125 mm, but may be thinner or thicker. Sheet thickness 110a is herein referred to as second linear thickness 110a.

As defined herein, linear thickness of a sheet refers to the maximum thickness between two opposite surfaces of the sheet. This definition applies to planar sheets (so-called flat sheets) and curved (or bent) sheets.

As FIGS. 1, 2, and 3 further show, a metal leadframe with a general QFN-type configuration has leads 150 and 160 and a flat device assembly pad (DAP) 151. In the example shown, pad 151 has a rectangular shape and the leads 150 and 160 are arranged parallel to one or more sides of rectangular pad 151. It should be noted that other embodiments may have different lead configurations, especially for specific heat distribution needs. The surface area 153 of pad 151 and the surfaces 154 of leads 150 and 160 are exposed on package surface 102 and are coplanar with surface 102.

The preferred method of fabricating the leadframe is by stamping from a starting sheet of metal in a low cost batch process. The footprint of the leadframe is preferably the standard QFN/SON footprint so that later no extra corrective metal layer is needs to be deposited and patterned to mimic the standard QFN footprint.

As FIG. 2 illustrates, the leadframe has a thickness 150a; it is referred to herein as first linear thickness 150a. Leadframe thickness 150a is preferably between about 0.120 and 0.130 mm, more preferably 0.125 mm, but may be thinner or thicker. The leadframe is preferably made of copper or copper alloy; other alternatives include iron-nickel alloys (such as Alloy 42), aluminum, and Kovar™. FIGS. 2 and 3 further indicate that pad 151 has a thickness 151a, which is reduced compared to thickness 150a. A preferred method of manufacturing the reduced thickness is partial etching of the leadframe. The value of reduced thickness 151a is selected so that the sum of thickness 151a together with the thickness 140a of the semiconductor power chip 140, attached to pad 151, and the adhesive material is equal to leadframe thickness 150a.

For the process step of assembling chip 140 on pad 151, the pad surface 153 coplanar with lead surfaces 154 is facing downward. No special flip-chip equipment is needed for attaching the chip onto pad surface 152, facing upward during chip assembly.

In the exemplary embodiment of device 100, the first terminal of FET 140, attached to pad 151, is the transistor drain. The second terminal, the transistor source, and the third terminal, the transistor gate, are remote from the pad. The source is connected to clip 110, which in turn connects to package terminals 150 (it should be mentioned that the connection of clip 110 to terminal 150 frees the clip from serving in an electrical function to serve solely for connection to a heat sink). The gate is connected to clip 112, which in turn connects to package terminals 160. Compared to second linear thickness 110a of clip 110, clip 112 has a reduced thickness 112a, herein referred to as third linear thickness. Due to the reduced thickness 112a, clip 112 can be covered by packaging compound 130 in the encapsulation process. Consequently, only surface 111 of clip 110 remains un-encapsulated and thus available for attaching a heat sink to clip 110; this heat sink can now extend over the whole surface 101 of device 100 for maximizing the size of the heat sink and thus maximizing the cooling effect.

As FIGS. 1, 2 and 3 illustrate, the structure of device 100 results in package thickness 104 to be the sum the first linear thickness 150a of the leadframe and the second linear thickness 110a of clip 110, plus any adhesion material 170. As stated, this sum produces a thickness 104 of about 0.3 mm. Adhesion material 170 is selected from a group including solder, conductive adhesive, z-axis conductor, carbon tubes, and graphene.

Figure 4B:
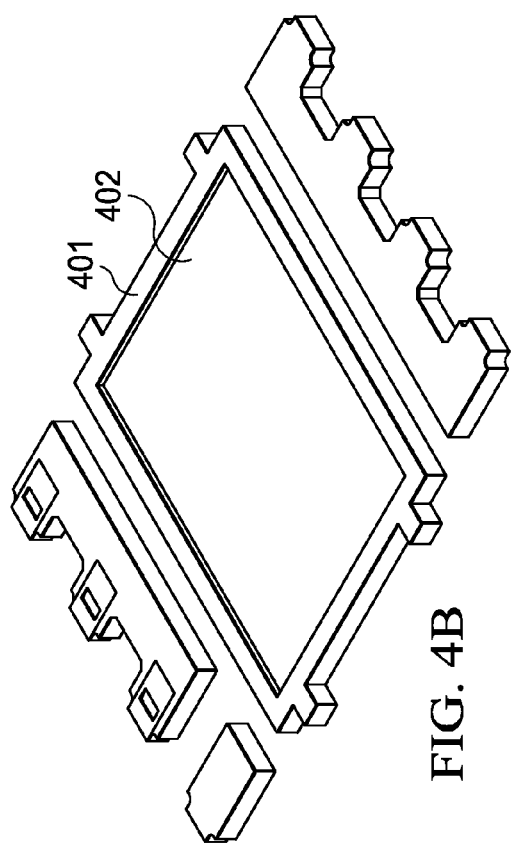
FIG. 4B is a perspective view of the leadframe used in the embodiment of FIG. 4A, showing a cavity etched into the leadframe pad.
Figure 4A:
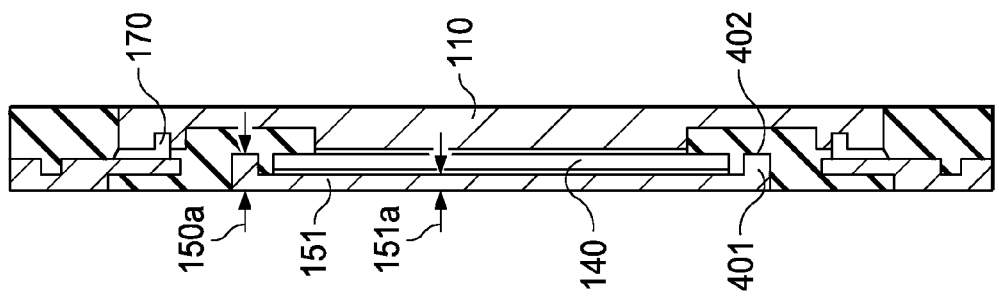
FIG. 4A depicts a cross section of another embodiment of the packaged FET of FIG. 1 along the line marked FIG. 2 in FIG. 1.

These statements also hold, when the reduced thickness 151a of the leadframe pad 151 is restricted to that portion of the pad, which serves to attach FET chip 140 (device assembly pad, DAP), while the remainder of the pad retains the first linear thickness 150a. As an example in FIGS. 4A and 4B, the first linear thickness may be retained along one or more perimeter portions 401 of the DAP (402), forming a rim-like border of the DAP. Such border is helpful to prevent unwanted solder flashing. As mentioned, a structure of reduced thickness with borders at one or more perimeter sections can be fabricated from the original leadframe by a partial etching technique. In a cross section as shown in FIG. 4A and in a perspective view as in FIG. 4B, the leadframe pad appears as containing the DAP 402 like a cavity surrounded by rims 401. In other embodiments, rim 401 may only be along one, or two, or three pad sides.

As FIG. 4A shows, the cavity is etched into the leadframe pad so that the FET chip 140 can be immersed into the cavity. Chip 140 is then attached to the cavity using an adhesive such as solder or conductive adhesive. As illustrated in FIG. 2, after attaching the chip bottom terminal to the pad cavity (surface 152), the top chip terminals are coplanar with the rim surface 402. The distance between rim surface 402 and pad bottom 153 is the leadframe first linear thickness 150a. As stated above, the first linear thickness is preferably 0.125 mm; the second linear thickness 110a of clip 110 is preferably 0.125 mm; and adhesion material 170 (selected from a group including solder, conductive adhesive, z-axis conductor, carbon tubes, and grapheme) is preferably about 0.05 mm. In sum, the power package has a preferred thickness of preferably 0.3 mm. As FIG. 4A further shows, clip 110 to interconnect the top chip terminal to package terminals has no rim bent at an angle from the clip plane. Using a flat clip reduces parasitic resistance and inductance by 20 to 30% (see below) compared to conventional clips with bent rims. The absence of bent rims further reduces the ringing of transistor off-on-off switches by about 50%.

Packaging material 130 encapsulates the transistor chip assembled on the leadframe so that the coplanar pad surface 153 and package terminal surface 154 remain un-encapsulated on one side of device 100, and the clip surface 111 remains un-encapsulated on the opposite device surface. As stated, both surfaces are available for cooling and attachment of heat sinks. The packaging material buries the metal sheet 112 of the third linear thickness.

Figure 5:
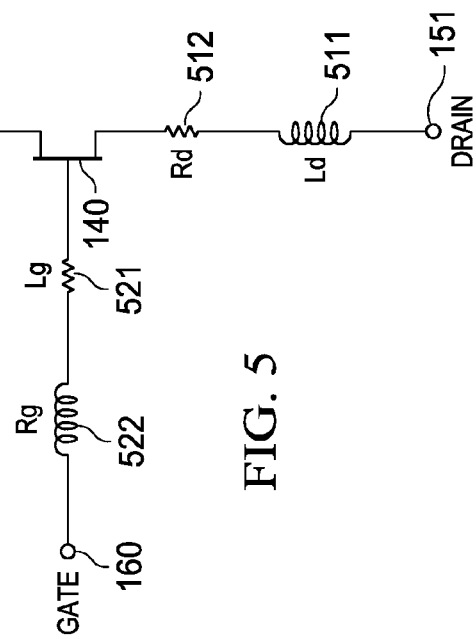
FIG. 5 is a schematic circuit diagram of the FET of FIG. 1 emphasizing parasitic resistances and inductances.

The schematic circuit diagram of FIG. 5 summarizes the electrical components, which contribute to performance improvements of the power FET device based on the minimized components in the package structure described in FIGS. 1, 2, and 3. Since the diagram considers only the package contributions, such models are commonly referred to as die-free resistance/die-free inductance models. From the viewpoint of electrical characteristics, main beneficial contributions originate from clip 110 being a flat clip without conventional elongation by bent rims, and from leadframe pad 151 being a pad of reduced thickness compared to the first linear leadframe thickness. Performance improvements can be found in higher efficiency, in higher velocity, and in higher current compared to conventional power FET packages.

The efficiency of the power FET device can be increased by reducing the power loss:

$$\text{efficiency} = \text{output power}/\text{input power}$$

$$= \text{output power}/(\text{output power} - \text{power loss})$$

The power loss is determined by:

$$\text{Power loss} = \text{conduction loss} + \text{switching loss};$$

$$\text{power loss} = I^2 R + P_{SW};$$

wherein I=current, R includes intrinsic and parasitic resistance, and intrinsic and parasitic inductance. Contributing to switching loss $P_{SW}$ are parasitic capacitances within the chip, which reduce moving charges, and parasitic resistances R within the package, which prolong the time to charge the chip capacitances. The power loss can be reduced and thus the efficiency increased by proceeding along three approaches: Reducing conduction loss by reducing parasitic resistance and inductance at the FET source; reducing switching loss and thus heat generation at the device level by reducing parasitic resistance at the FET drain; and improving heat dissipation at the board level.

The velocity of a power FET characterizes the switching of the transistor from "off" to "on" operation and back to "off". The FET can switch faster when the time for charging the chip capacitor is reduced, which can be achieved by reducing the package resistance. Finally, the current through the FET, allowed before the junction temperature limit is reached, can be increased by improving the efficiency of the FET junction cooling. As described above, due to the thinness of device 100 in FIGS. 1, 2 and 3, effective double-cooling can be achieved by heat sinks on both sides of device 100.

In the circuit diagram of FIG. 5, the package terminals are given designations identical to the respective designations in FIGS. 1 to 3: Drain terminal pad 151 (serving first FET terminal), source terminal pad 150 (serving second FET terminal), and gate terminal pad 160 (serving third FET terminal). The parasitic source inductance $L_S$ (designated 501), conventionally about 0.4 nH, is reduced by about 20 to 30% due to avoiding the conventional elongated clip with bent rims. The parasitic source resistance $R_S$ (502), conventionally about 0.2 mΩ, is reduced by about 20 to 30% due to avoiding the conventional elongated clip with bent rims. The parasitic drain inductance $L_D$ (designated 511) is practically negligible due to the reduced leadframe contribution based on the reduced thickness of the leadframe pad. The parasitic drain resistance $R_D$ (designated 512), conventionally about 0.001 mΩ, is practically negligible due to the reduced leadframe contribution based on the reduced thickness of the leadframe pad. The parasitic gate inductance $L_G$ (designated 521), about 1.54 nH, is not affected by the use of a rim-free clip and a reduced-thickness pad. The parasitic gate resistance $R_G$ (designated 522), about 22 mΩ, is not affected by the use of a rim-free clip and a reduced-thickness pad.

The structure of the molded package of device 100 as shown in FIGS. 1 to 4A allows a two-way cooled operation with a first heat sink attached to clip 110 and a second heat sink to leadframe pad 151 on the opposite package surface. The effective cooling of the FET junction allows currents between 25 and 40 A before the junction temperature of 150° C. is reached.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors.

As another example, the high current capability of the power supply module can be further extended, and the efficiency further enhanced, by connecting the clip to a heat sink, preferably by solder, and concurrently connecting the leadframe pad to a cooled substrate or heat sink. In this configuration, the module can dissipate its heat from both surfaces to heat sinks and the transistor junction can handle more current, before the limiting junction temperature of 150° C. is reached.

It is therefore intended that the appended claims encompass any such modifications or embodiments.

We claim:

1. A transistor package comprising:
   a leadframe of a first linear thickness, the leadframe having a pad;
   a transistor chip attached to the pad, the transistor having a first terminal in contact with the pad and a second and a third terminal remote from the pad, wherein the leadframe pad has been half-etched to create a cavity into which the transistor chip can be immersed; and
   a metal sheet of a second linear thickness connecting the second transistor terminal to a package terminal, and a metal sheet of a third linear thickness connecting the third transistor terminal to a package terminal, wherein the sum of the first and second linear thicknesses comprising a package thickness.

2. The package of claim 1 wherein the package thickness is equal to or smaller than 0.3 mm.

3. The package of claim 2 further including a rim along at least a portion of the pad perimeter, wherein the thickness of rim and pad is equal to the first linear thickness.

4. The package of claim 3 further including packaging material encapsulating the transistor chip attached to the pad so that the pad surface and lead surfaces opposite the chip remain un-encapsulated.

5. The package of claim 4 further having un-encapsulated the sheet surface opposite the attached second transistor terminal.

6. The package of claim 1 wherein the third linear thickness is smaller than the second linear thickness.

7. The package of claim 6 wherein the packaging material encapsulates the sheet of the third linear thickness.

8. The package of claim 7 wherein the package terminals have a standard QFN footprint.

9. The package of claim 5 wherein the un-encapsulated pad and sheet surfaces are planar.

10. The package of claim 1 wherein the first transistor terminal is the drain, the second terminal is the source, and the third terminal is the gate.

* * * * *